(12) United States Patent
Ainspan et al.

(10) Patent No.: US 8,665,034 B2
(45) Date of Patent: Mar. 4, 2014

(54) VARACTOR TUNING CONTROL USING REDUNDANT NUMBERING

(75) Inventors: Herschel A. Ainspan, New Hempstead, NY (US); Daniel J. Friedman, Sleepy Hollow, NY (US); Alexander V. Rylyakov, Mount Kisco, NY (US); Jose A. Tierno, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 162 days.

(21) Appl. No.: 13/245,409

(22) Filed: Sep. 26, 2011

(65) Prior Publication Data
US 2013/0076449 A1   Mar. 28, 2013

(51) Int. Cl.
*H03B 5/08* (2006.01)

(52) U.S. Cl.
USPC ........... 331/167; 331/1 A; 331/1 R; 331/36 C

(58) Field of Classification Search
USPC ...... 331/1 A, 1 R, 16, 36 C, 111, 167, 177 R, 331/177 V
See application file for complete search history.

(56) References Cited

U.S. PATENT DOCUMENTS

| 6,760,575 B2 | 7/2004 | Welland |
| 6,774,736 B1 | 8/2004 | Kwek et al. |
| 7,042,253 B2 | 5/2006 | Su et al. |
| 7,173,495 B1 | 2/2007 | Kenny et al. |
| 2006/0003720 A1* | 1/2006 | Lee et al. ................. 455/264 |
| 2009/0085681 A1* | 4/2009 | Lin et al. ................. 331/111 |
| 2009/0111408 A1 | 4/2009 | Rodal |
| 2010/0001784 A1* | 1/2010 | Moussavi ................. 327/512 |

FOREIGN PATENT DOCUMENTS

EP   0395109 A1   10/1990

OTHER PUBLICATIONS

P-L. Chen et al., "A Portable Digitally Controlled Oscillator Using Novel Varactors," IEEE Transactions on Circuits and Systems II, May 2005, pp. 233-237, vol. 52, No. 5.
J. Zhuang et al., "A 4GHz Low Complexity ADPLL-Based Frequency Synthesizer in 90nm CMOS," IEEE Custom Integrated Circuits Conference (CICC), Sep. 2007, pp. 543-546.

* cited by examiner

*Primary Examiner* — Joseph Chang
*Assistant Examiner* — Jeffrey Shin
(74) *Attorney, Agent, or Firm* — Anne V. Dougherty; Ryan, Mason & Lewis, LLP

(57) ABSTRACT

Techniques for improved tuning control of varactor circuits are disclosed. For example, an apparatus comprises a plurality of varactors for tuning a frequency value. The plurality of varactors comprises approximately sqrt(2N) varactors, where N is a number of tuning steps and the plurality of varactors are respectively sized as 1x, 2x, 3x, 4x, . . . , approximately sqrt(2N)x, and where x is a unit of capacitance. A given one of the N tuning steps may be represented by more than one combination of varactors. This may be referred to as redundant numbering.

20 Claims, 5 Drawing Sheets

100

| INC | DEC | RN-DCO CONTROLS | FREQUENCY |
|---|---|---|---|
| 1 | 0 | 100 000 000 000 | F0+ΔF |
| 1 | 0 | 010 000 000 000 | F0+2ΔF |
| 1 | 0 | 110 000 000 000 | F0+3ΔF |
| 1 | 0 | 101 000 000 000 | F0+4ΔF |
| 1 | 0 | 011 000 000 000 | F0+5ΔF |
| 1 | 0 | 111 000 000 000 | F0+6ΔF ← 302 |
| 1 | 0 | 110 100 000 000 | F0+7ΔF |
| 0 | 1 | 010 100 000 000 | F0+6ΔF ← 304 |
| 0 | 1 | 100 100 000 000 | F0+5ΔF |

VARACTOR TUNING CONTROL USING REDUNDANT NUMBERING

STATEMENT REGARDING FEDERALLY SPONSORED RESEARCH

This invention was made with Government support under Contract No.: FA8650-09-C-7924 awarded by the Defense Advanced Research Projects Agency (DARPA). The Government has certain rights in this invention.

FIELD OF THE INVENTION

The present invention relates generally to varactor circuits and, more particularly, to improved tuning control of such varactor circuits.

BACKGROUND OF THE INVENTION

Variable capacitors (varactors) are widely used in integrated circuits (chips) for clocking and input/output (I/O) applications, e.g., inductor-varactor digitally-controlled oscillators (LC DCOs) to provide a stable desired frequency, or impedance-matching circuits to reduce signal loss at chip inputs or outputs. Tuning is achieved by varying an input control signal to the varactor to change the capacitance value from a low value to a high value and back again. The DCO tuning range is typically divided into overlapping frequency bands (e.g., 16 bands), using a bank of coarse tune varactors to set the band, and each band is subdivided into N overlapping frequency steps, using a bank of fine tune varactors to achieve the exact desired frequency. The fine tune varactor bank is controlled by a digital phase locked loop (DPLL).

The DPLL effectively sends to the varactors a digital word that represents the desired DCO frequency, e.g., the DPLL turns on more of the N fine tune varactors to force the DCO frequency to increase. The representation of this digital word determines the DCO varactor implementation, involving tradeoffs in DCO tuning range and noise performance and varactor on-chip device matching requirements.

In terms of tuning range, using more bits to represent the digital word requires more varactors. Each added varactor adds wiring parasitic capacitance to the DCO LC tank and undesirably reduces DCO tuning range. In terms of noise performance, switching more and larger varactors degrades DCO phase noise performance. In terms of matching requirements, using fewer bits requires tighter varactor device matching, which can be difficult to achieve in chip technologies.

Two examples of digital word encoding schemes typically used in DCO design are binary and thermometer coding (N herein again representing the number of steps in the DCO fine tuning). In binary coding, the varactors are sized in powers of 2, e.g., 1x, 2x, 4x, 8x, where x is a unit capacitance. The number of binary bits required to encode the digital word is minimal (4 in this example), providing wide DCO tuning range, but the varactor matching required is very tight, e.g., varactor 1x and varactor 8x must match (1x must provide ⅛ of the capacitance of 8x). In thermometer coding, each varactor is of identical 1x size. The number of bits required is very large (N), thus limiting DCO tuning range, but the matching required is minimal (1x must match 1x). These two coding schemes thus represent the extremes of the spectrum of coding choices, and neither one is very attractive in terms of DCO performance.

SUMMARY OF THE INVENTION

Embodiments of the invention provide techniques for improved tuning control of varactor circuits.

For example, in one embodiment of the invention, an apparatus comprises a plurality of varactors for tuning a frequency value. The plurality of varactors comprises approximately sqrt(2N) varactors, where N is a number of tuning steps and the plurality of varactors are respectively sized as 1x, 2x, 3x, 4x, ..., approximately sqrt(2N)x, and where x is a unit of capacitance. A given one of the N tuning steps may be represented by more than one combination of varactors. This may be referred to as redundant numbering.

In another embodiment, an apparatus comprises a plurality of varactors for tuning a frequency value. Respective varactors of the plurality of varactors are sized in consecutively increasing increments of one unit of capacitance, and the total number of varactors in the plurality of varactors is a function of a number N of tunings steps.

Advantageously, when one or more embodiments of the invention are used in a digital phase locked loop circuit (DPLL), the performance of the DPLL is enhanced. For example, such a redundant-numbering representation of a digitally-controlled oscillator (DCO) varactor implementation provides DPLL improvements in terms of DCO tuning range and varactor on-chip device matching requirements.

These and other features, objects and advantages of the present invention will become apparent from the following detailed description of illustrative embodiments thereof, which is to be read in connection with the accompanying drawings.

DETAILED DESCRIPTION OF THE INVENTION

Illustrative embodiments of the invention will be described herein in the context of a digitally-controlled oscillator (DCO) used in a digital phase locked loop (DPLL) circuit architecture. However, it is to be understood that principles of the invention are not limited to the specific architectures described herein. For example, the inventive techniques can be used to control any varactor bank, such as for tuning a resonant inductor-varactor circuit for impedance matching of input/output circuits, etc.

Figure 1:
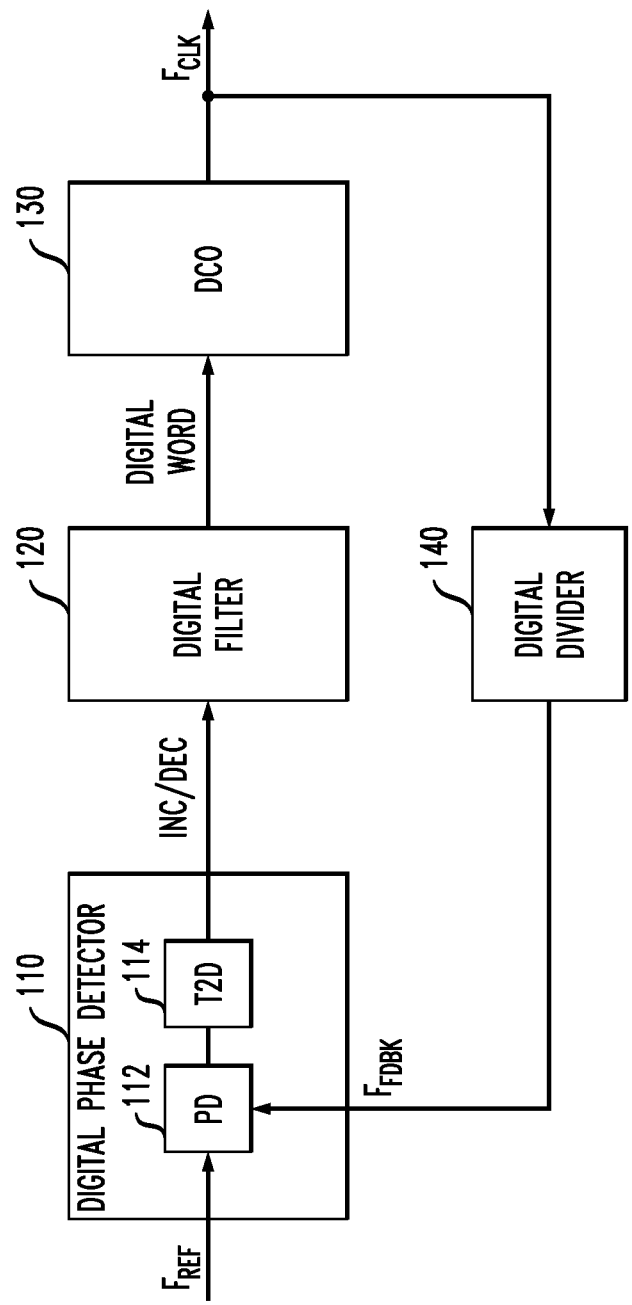
FIG. 1 is a block diagram of an exemplary digital phase locked loop circuit in which one or more embodiments of the invention may be implemented.

FIG. 1 is a block diagram of an exemplary digital phase locked loop circuit 100 in which one or more embodiments of the invention may be implemented. It is to be understood that the DPLL architecture shown in FIG. 1 is one example of a DPLL circuit with which embodiments of the invention may be implemented. Thus, embodiments of the invention may be implemented in other circuit architectures.

As shown, DPLL 100 comprises a digital phase detector 110, a digital filter 120, a digitally-controlled oscillator (DCO) 130 and a digital divider 140. In general, DPLL 100 synchronizes the output frequency (Fclk) of the DCO 130 to an input reference frequency (Fref) via feedback through digital divider 140.

More particularly, the digital phase detector 110 comprises a phase/frequency detector 112 and a time-to-digital (T2D) converter 114. The phase/frequency detector 112 detects the difference between the input reference phase/frequency (Fref) and the output phase/frequency (Fclk) of the DCO 130 divided down by the digital divider 140. The T2D converter 114 converts the difference information from the phase/frequency detector 112 in order to produce an increment/decrement (INC/DEC) signal used to control the frequency of the DCO 130 depending on the difference information. The digital filter 120 receives the INC/DEC signal output from the digital phase detector 110 and generates a corresponding digital word used to directly control the DCO frequency. The filter 120 also provides smoothing for the incremental adjustment of the DCO 130 and loop filtering for the DPLL 100.

As mentioned above, the DPLL 100 sends the DCO 130 a digital word that represents the desired DCO frequency. Assuming the DCO 130 is a varactor-based DCO implementation, the digital word turns on one or more fine tune varactors in the DCO to force the DCO frequency to the desired value.

As also mentioned above, the representation of this digital word determines the DCO varactor implementation, and involves tradeoffs in DCO tuning range and noise performance and varactor on-chip device matching requirements. However, it is realized that the two known coding schemes (binary coding and thermometer coding) represent the extremes of the spectrum of coding choices, and neither one is very attractive in terms of DCO performance. Accordingly, illustrative embodiments of the invention provide for improved digitally-controlled oscillators which use a redundant numbering approach to overcome these and other drawbacks of existing DCO approaches.

Figures 2, 3:
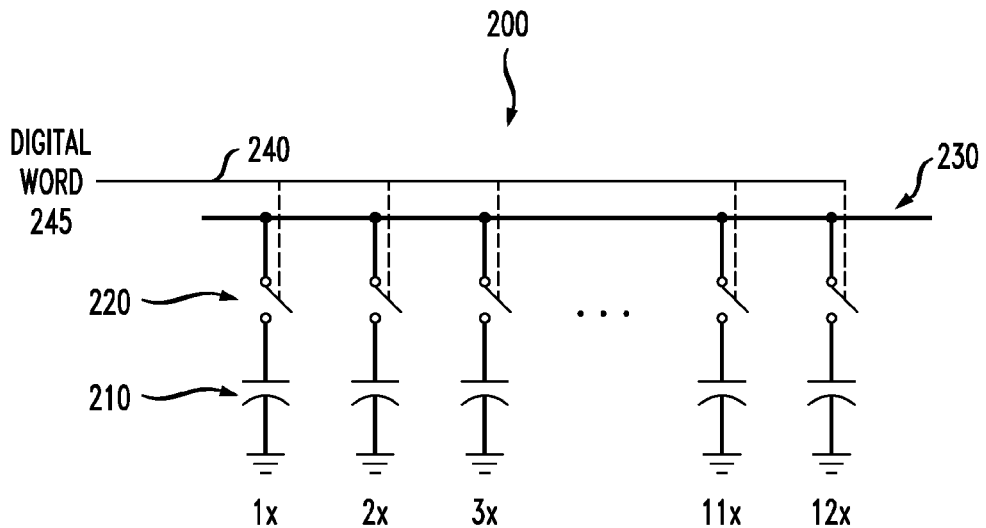
FIG. 2 is a block diagram showing at least a portion of a redundant numbering digitally-controlled oscillator, according to an embodiment of the invention.
FIG. 3 is a table of example sequences of redundant numbering digitally-controlled oscillator control bits and resultant frequencies, according to an embodiment of the invention.

FIG. 2 is a block diagram showing at least a portion of a digitally-controlled oscillator (DCO) circuit, according to an embodiment of the invention. More specifically, a fine tune varactor bank 200 is shown in FIG. 2. The overall DCO circuit may comprise other components/elements as will be explained below. The fine tune varactor bank 200 can be part of the DCO 130 shown in the DPLL 100 of FIG. 1.

The fine tune varactor bank 200 comprises a plurality of varactors 210 and switches 220. Each varactor 210 is connected in series with a switch 220 such that the closure of the switch 220 connects a first terminal of the varactor 210 to a common signal line 230. The second terminal of each varactor 210 is connected to ground. The total capacitance of the fine tune varactor bank 200 is equivalent to the sum of the capacitance values of all varactors 210 that are connected to the common signal line 230 by closed switches 220.

Each of the varactors 210 shown in FIG. 2 has a capacitance value that is an integer multiple of a unit capacitance x. FIG. 2 shows twelve varactors having capacitance values of 1x thru 12x in increments of 1x. While FIG. 2 shows an example having twelve varactors, embodiments of the invention are not limited to this amount of varactors, thus there could be more or less varactors.

The fine tune varactor bank 200 is controlled by a digital phase locked loop (DPLL). The DPLL sends to the set of varactors, across a digital word line 240 connected to each switch 210, a digital word 245 that represents the desired DCO frequency. For example, the digital word contains a set of bits whose respective values determine whether to close or open a corresponding one of the switches and thus turn on or off the corresponding varactor. By turning on more varactors, this forces the DCO frequency to increase. By turning on less varactors, this forces the DCO frequency to decrease.

It is to be understood that the DCO circuit, as mentioned above, may also contain a set of coarse tune varactors (not shown) that set the frequency band (i.e., the coarse frequency value). Each band is subdivided into N overlapping frequency steps, using a set of fine tune varactors (such as that shown in FIG. 2), to achieve the exact (fine) desired frequency value.

In accordance with one embodiment of the invention, the redundant-numbering (RN) representation of the N steps in the DCO fine tuning approach employs approximately sqrt(2N) varactors, sized as 1x, 2x, 3x, 4x ... sqrt(2N)x, as shown in FIG. 2. For example, to achieve N=78 steps in the fine tuning portion of the DCO, the RN approach uses 12 varactors, sized 1x, 2x, 3x, 4x, 5x, 6x, 7x, 8x, 9x, 10x, 11x, 12x. That is, the square root of two times 78 is 12.49, or approximately 12. Thus, after rounding down in this example, it is realized that 12 varactors configured as shown in FIG. 2 will allow for 78 steps in the fine tuning portion of the DCO.

As shown in the table of FIG. 3, each desired step can be represented by more than one combination of these 12 varactors, hence the term "redundant numbering." In an illustrative example from the table of FIG. 3, to set the frequency to a value of F0+6ΔF, the RN-DCO receives a digital word set to either 111 000 000 000, wherein the 1x, 2x and 3x varactors are switched on (denoted as 302 in FIG. 3), or a digital word set to 010 100 000 000 (denoted as 304 in FIG. 3), wherein the 2x and 4x varactors are switched on. Note that F0 is the coarse tuned frequency value set by the selection of a coarse varactor (not shown) and 6ΔF represents a fine tuned frequency value that represents six units x of capacitance (recall that x is a unit capacitance). Thus, six units x of capacitance can be achieved by turning on the 1x, 2x and 3x (equivalent to 6x) varactors in FIG. 2 and leaving the rest of the varactors off, or by turning on the 2x and 4x (equivalent to 6x) varactors in FIG. 2 and leaving the rest of the varactors off. Likewise, although not specifically shown in the table, the same fine tuned frequency value can be achieved by turning on the 6x varactor alone, or the 1x and 5x varactors.

Thus, to achieve 78x (where N is 78 for this example) units of capacitance, all 12 varactors in FIG. 2 would be turned on. To achieve less than Nx units of capacitance, one of ordinary skill in the art will realize, given the above exemplary description, the various combinations of varactors that could be turned on in order to achieve a desired fine frequency value.

Advantageously, the inventive RN approach allows a middle-of-the-road tradeoff of number of varactors, and thus a suitable compromise of parasitic capacitance, switching events and matching requirements.

Figure 4:
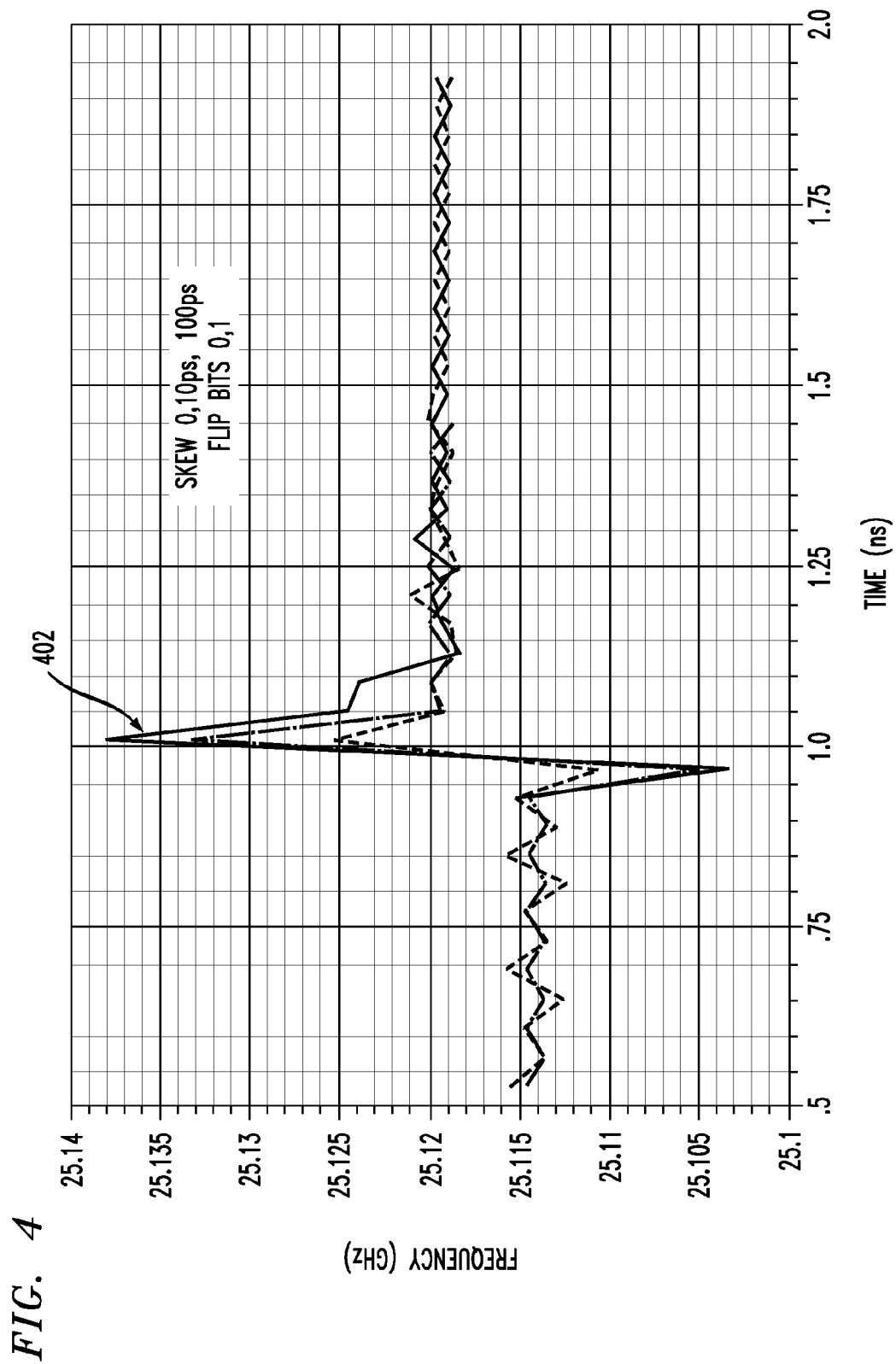
FIG. 4 is a simulated plot of frequency versus time at a transition between two states of a redundant numbering digitally-controlled oscillator, according to an embodiment of the invention.

One concern that arises with simultaneous switching of varactors is the jump in frequency at the switching event in the presence of skew between the switches controlling the varactors. FIG. 4 shows a simulation of the RN-DCO frequency as a function of time during such a switching event. In an illustrative example, for a 25 GHz DCO, and switching skews of 0 ps (picoseconds), 10 ps, or 100 ps, the waveforms of FIG. 4 show the jump in frequency is minimal. The frequency overshoot and undershoot before settling to the new frequency is shown in the table of FIG. 5.

Figures 5, 6:
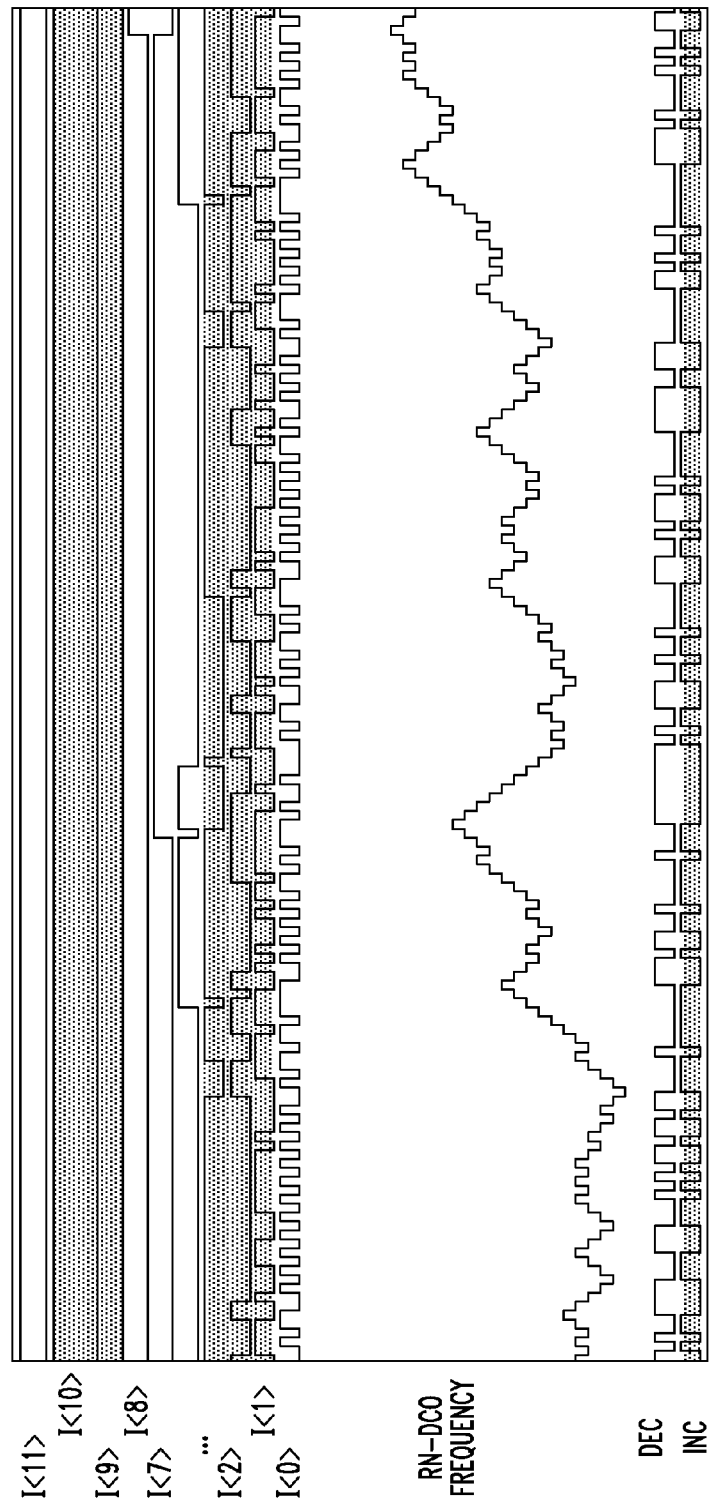
FIG. 5 is a table of undershoot and overshoot frequencies of a redundant numbering digitally-controlled oscillator resulting from various switching skews, according to an embodiment of the invention.
FIG. 6 is a simulated plot of a redundant numbering digitally-controlled oscillator and a resultant frequency in a digital phase locked loop circuit, according to an embodiment of the invention.

In an illustrative example, simulation waveform 402 of FIG. 4 advantageously shows that in the case of a switch skew of 100 ps, the undershoot, at 25 GHZ nominal frequency, is only 10 MHz, while the overshoot is only 24 MHz (see 502 in the table of FIG. 5). The overshoot is only for one or two clock cycles and by the third clock cycle, the DCO has reached its new frequency as shown in FIG. 4.

FIG. 6 shows a simulation of a redundant numbering digitally-controlled oscillator (RN-DCO) for the DPLL, according to one embodiment of the invention. FIG. 6 includes increment (INC) and decrement (DEC) signals from the digital phase detector (110 in FIG. 1) which control an increase or a decrease of the DCO frequency, varactor control signals I<0> thru I<11> (which constitute the digital word 245 referred to above), and the resulting RN-DCO frequency.

The simulation results in FIG. 6 show correct conversion of INC/DEC signals in the loop filter into the I<0> . . . I<11>DCO controls, wherein I<0> . . . I<11> are the controls signals for switching varactors 1x, 2x . . . 12x shown in FIG. 2. Signals I<0> . . . I<11>, shown in FIG. 6, highlight two key features of the RN control including that, at most, two of the 12 I-controls switch at a time, and the stronger the I-control, the less often it switches. The signals are called "I-controls" because the DPLL has separate integral and proportional control paths. The RN technique is applied only to the integral path. So the integral controls are called I<0:11>, and the proportional (not shown, as not being related to this description) are called P<0:7>. Stronger I-control means a higher bit number, i.e., I<0> is the weakest I-control, the least significant bit, and I<11> is the strongest I-control, the most significant bit.

The RN-DCO methodologies described herein provide significant advantages over existing fine tune varactor control techniques. By way of example, one advantage is that the redundant numbering varactor sizing allows a smaller number of varactors compared to a thermometer coding approach, and thus lower wiring capacitance on the varactors. This translates to a wider DCO tuning range and a better DCO noise performance. By way of another example, another advantage is that the redundant numbering varactor sizing allows reduced matching requirement on the varactors compared to a binary coding, which translates to better chip yield and more uniform DPLL performance.

Figure 7:
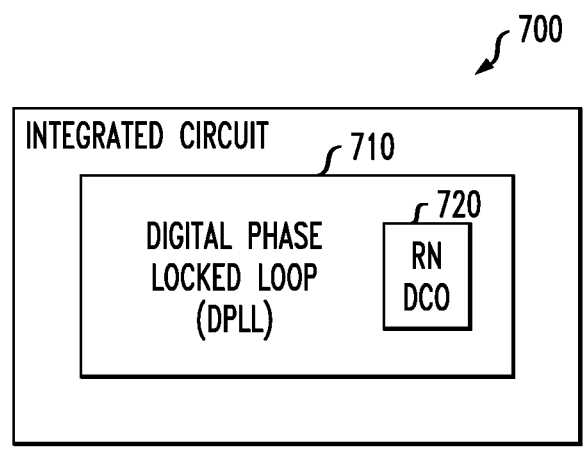
FIG. 7 is a block diagram of an integrated circuit including a digital phase locked loop circuit and a redundant numbering digitally-controlled oscillator circuit, according to an embodiment of the invention.

FIG. 7 illustrates an integrated circuit 700 in which a digital phase locked loop (DPLL) circuit 710 with a redundant numbering digitally-controlled oscillator (RN-DCO) 720 is formed. It is to be understood that, in one embodiment, the RN-DCO 720 may include the configuration shown in FIG. 2, while the DPLL 710 may be in the configuration shown in FIG. 1.

It is to be appreciated that, in an illustrative integrated circuit implementation of the invention, such as that shown in FIG. 7, one or more integrated circuit dies are typically formed in a pattern on a surface of a wafer. Each such die may include a device comprising circuitry as described herein, and may include other structures or circuits. The dies are cut or diced from the wafer, then packaged as integrated circuits. One ordinarily skilled in the art would know how to dice wafers and package dies to produce packaged integrated circuits. Integrated circuits, manufactured as above and/or in other ways, are considered part of this invention. While the DPLL 710 and RN-DCO 720 are shown in FIG. 7 as being formed in one integrated circuit, it is to be understood that the circuits can be formed across multiple integrated circuits.

It will be appreciated and should be understood that the exemplary embodiments of the invention described above can be implemented in a number of different fashions. Given the teachings of the invention provided herein, one of ordinary skill in the related art will be able to contemplate other implementations of the invention. Indeed, although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An apparatus comprising:
a first varactor; and
at least a second varactor operatively connected to the first varactor, wherein the first varactor and the at least a second varactor form at least part of a plurality of varactors;
the plurality of varactors are configured for tuning a frequency value, wherein the plurality of varactors comprises approximately sqrt(2N) varactors, where N is a number of tuning steps and the plurality of varactors are respectively sized as 1x, 2x, 3x, 4x, . . . , approximately sqrt(2N)x, where x is a unit of capacitance.

2. The apparatus of claim 1, wherein a given one of the N tuning steps can be represented by more than one combination of varactors.

3. The apparatus of claim 1, further comprising a plurality of switches, wherein the plurality of switches are operatively connected to the plurality of varactors, and are configured to selectively turn on and off each varactor in response to a control signal.

4. The apparatus of claim 3, wherein the control signal comprises a digital word with a plurality of bits, wherein a given one of the bits of the digital word corresponds to a given one of the plurality of switches.

5. The apparatus of claim 4, wherein the digital word is provided by a digital phase locked loop circuit.

6. The apparatus of claim 4, wherein the given one of the bits of the digital word is set to a first logic value to close the given one of the plurality of switches and thus turn on the corresponding varactor.

7. The apparatus of claim 6, wherein the given one of the bits of the digital word is set to a second logic value to open the given one of the plurality of switches and thus turn off the corresponding varactor.

8. The apparatus of claim 7, wherein a capacitance value of each varactor that is turned on contributes to a total capacitance value, wherein the total capacitance value corresponds to the size of an adjustment made to the frequency value.

9. An apparatus, comprising:
a digitally-controlled oscillator circuit comprising a plurality of varactors for tuning a frequency value, wherein the plurality of varactors comprises approximately sqrt(2N) varactors, where N is a number of tuning steps and the plurality of varactors are respectively sized as 1x, 2x, 3x, 4x, . . . , approximately sqrt(2N)x, where x is a unit of capacitance; and
a digital phase locked loop circuit for controlling the digitally-controlled oscillator circuit.

10. The apparatus of claim 9, wherein a given one of the N tuning steps can be represented by more than one combination of varactors.

11. The apparatus of claim 9, further comprising a plurality of switches, wherein the plurality of switches are operatively connected to the plurality of varactors, and are configured to selectively turn on and off each varactor in response to a control signal received from the digital phase locked loop circuit.

12. The apparatus of claim 11, wherein the control signal comprises a digital word with a plurality of bits, wherein a given one of the bits of the digital word corresponds to a given one of the plurality of switches.

13. The apparatus of claim 12, wherein the given one of the bits of the digital word is set to a first logic value to close the given one of the plurality of switches and thus turn on the corresponding varactor.

14. The apparatus of claim 13, wherein the given one of the bits of the digital word is set to a second logic value to open the given one of the plurality of switches and thus turn off the corresponding varactor.

15. The apparatus of claim 14, wherein a capacitance value of each varactor that is turned on contributes to a total capacitance value, wherein the total capacitance value corresponds to the size of an adjustment made to the frequency value.

16. The apparatus of claim 9, wherein the digitally-controlled oscillator circuit and the digital phase locked loop circuit are implemented in one or more integrated circuits.

17. A method for tuning a frequency value, comprising:
receiving a control signal representative of a desired frequency adjustment that is to be applied to the frequency value; and
applying the control signal to a plurality of varactors, wherein the plurality of varactors comprises approximately sqrt(2N) varactors, where N is a number of tuning steps and the plurality of varactors are respectively sized as 1x, 2x, 3x, 4x, . . . , approximately sqrt(2N)x, where x is a unit of capacitance;
wherein a capacitance value of each varactor that is turned on in response to the control signal contributes to a total capacitance value, wherein the total capacitance value corresponds to the desired frequency adjustment.

18. The method of claim 17, wherein the desired frequency adjustment can be achieved by selectively turning on more than one combination of varactors.

19. An apparatus, comprising:
a first varactor; and
at least a second varactor operatively connected to the first varactor, wherein the first varactor and the at least a second varactor form at least part of a plurality of varactors;
the plurality of varactors are configured for tuning a frequency value, wherein respective varactors of the plurality of varactors are sized in consecutively increasing increments of one unit of capacitance and wherein the total number of varactors in the plurality of varactors is a function of a number N of tuning steps.

20. The apparatus of claim 19, wherein a desired frequency value can be achieved by selectively turning on more than one combination of varactors.

\* \* \* \* \*